US007659781B2

(12) United States Patent
Chow et al.

(10) Patent No.: US 7,659,781 B2

(45) Date of Patent: Feb. 9, 2010

(54) ACTIVE RESISTOR USED IN A FEEDBACK AMPLIFIER PARTICULARLY USEFUL FOR PROXIMITY COMMUNICATION

(75) Inventors: Alex Chow, East Palo Alto, CA (US); Robert J. Drost, Los Altos, CA (US); Robert D. Hopkins, Hayward, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 29 days.

(21) Appl. No.: 12/143,991

(22) Filed: Jun. 23, 2008

(65) Prior Publication Data

US 2009/0315624 A1 Dec. 24, 2009

(51) Int. Cl.
*H03F 3/16* (2006.01)

(52) U.S. Cl. ...................................... 330/277; 330/291

(58) Field of Classification Search ................. 330/291, 330/260, 265, 277, 282, 86; 257/537–538
See application file for complete search history.

(56) References Cited

U.S. PATENT DOCUMENTS 5,617,064 A * 4/1997 Gorecki .................... 333/22 R
6,657,507 B2 * 12/2003 Fulton et al. ................ 331/158

OTHER PUBLICATIONS

Robert J. Drost et al., Proximity Communication, Sep. 2004, IEEE Journal of Solid-State Circuits, vol. 39, No. 9, Sep. 2004.

* cited by examiner

*Primary Examiner*—Robert Pascal
*Assistant Examiner*—Hieu P Nguyen
(74) *Attorney, Agent, or Firm*—Park, Vaughan & Fleming LLP

(57) ABSTRACT

An active resistor and its use in a negative feedback amplifier allow wide voltage swings on the input and output signals. One embodiment includes parallel pass-gate MOS transistors of opposite conductivity types connected between the input and output nodes. Bootstrapping transistors are connected between the gates of the pass-gate transistors and respective bias voltages. Coupling capacitors are connected between the gates and the output node. Additional coupling capacitors may be connected between the gates and the input node to make the resistor symmetric. In other embodiments, only one pass-gate transistor is used.

13 Claims, 7 Drawing Sheets

BIAS V+
54
50
NB
52
PC
26
60
P1
12
14
N1
28
62
NC
PB
56
58
BIAS V-

ACTIVE RESISTOR USED IN A FEEDBACK AMPLIFIER PARTICULARLY USEFUL FOR PROXIMITY COMMUNICATION

BACKGROUND

1. Field of the Invention

The invention relates generally to semiconductor amplifiers and non-linear resistors actively controlled according to voltages applied to them. In particular, the invention relates to sense amplifiers having negative feedback modulated according to the amplitude of the amplifier's signal.

2. Related Art

Proximity communication is an I/O technology that allows two chips in face-to-face alignment to communicate without wires as has been explained by Drost et al. in "Proximity Communication," *IEEE Journal of Solid-State Circuits*, vol. 39, no. 9, September 2004, pp. 1529-1535. In the most widely used implementation, corresponding arrays of electrode plates or pads are formed in the opposing surfaces of the two chips, which are then fixed together with a dielectric layer in between to form a large number of capacitively coupled communication links between the chips. Alternatively, the transmitting and receiving elements may be inductive loops acting as antennas or complementarily arranged optical transmitters and receivers. A transmitter on one chip impresses an electrical signal on one of its pads, and a receiver on the other chip detects the signal coupled to the corresponding one of its pads. Although proximity communication promises much higher input/output (I/O) density and lower power, detecting signals over proximity communication is a challenge. Signals coupled onto the plates of the receiving chip can be very small, on the order of 10 mV. With capacitively coupled proximity communication, the receiving nodes must also be biased at appropriate DC levels.

The need to detect small signals over a capacitively coupled interface poses significant challenges to the design of data receivers. Input offset subtracts from the received signal, degrading receiving sensitivity; for robust communication, offset cancellation shall be used, especially in advanced fabrication processes where transistor mismatch effects are more significant. An additional challenge is that of biasing the receiving node at a voltage level at which the amplifier has adequate gain.

SUMMARY

One embodiment of the present invention provides a negative feedback amplifier with an active feedback resistor, the resistance of which varies with the output of the amplifier.

The active feedback amplifier is particularly useful as a sense amplifier in a communication system, such as a proximity communication system in which signals are transmitted across interfaces of integrated circuit chips fixed together.

Another embodiment of the invention includes an active resistor the resistance of which varies with the voltage across the resistor.

In some embodiments, the active resistor includes one MOS pass-gate coupled connected between the input and output nodes, a bootstrapping MOS transistor coupled between the gate of the pass-gate transistor and a bias voltage, and a coupling capacitor coupled between the gate of the pass-gate transistor and the output node.

In other embodiments, the active resistor further includes a second coupling capacitor coupled between the gate of the pass-gate transistor and the input node so that the resistor may operate in either direction.

In further embodiments, the active resistor includes parallel MOS pass-gate transistors of opposite conductivity type, each having coupled to its gate a bootstrapping transistor coupled to a respective bias voltage and respective coupling capacitor to the resistor output.

DETAILED DESCRIPTION

The following description is presented to enable any person skilled in the art to make and use the invention and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

One aspect of this invention includes the design and operation of a single-ended semiconductor amplifier with offset compensation and a biased input node. Conventionally, as illustrated in the circuit diagram of FIG. 1, the simplest solution includes a CMOS inverter 10, with its input node 12 and output node 14 connected through a resistor 16 to provide negative feedback Drost et al. in U.S. Pat. No. 6,825,708 disclose a method of compensating offset in such an amplifier. Of course, any type of inverting amplifier can be used in place of the CMOS inverter, and the described apparatus can be extended to any different signaling scheme using differential amplifiers, such as differential pairs.

Figure 1:
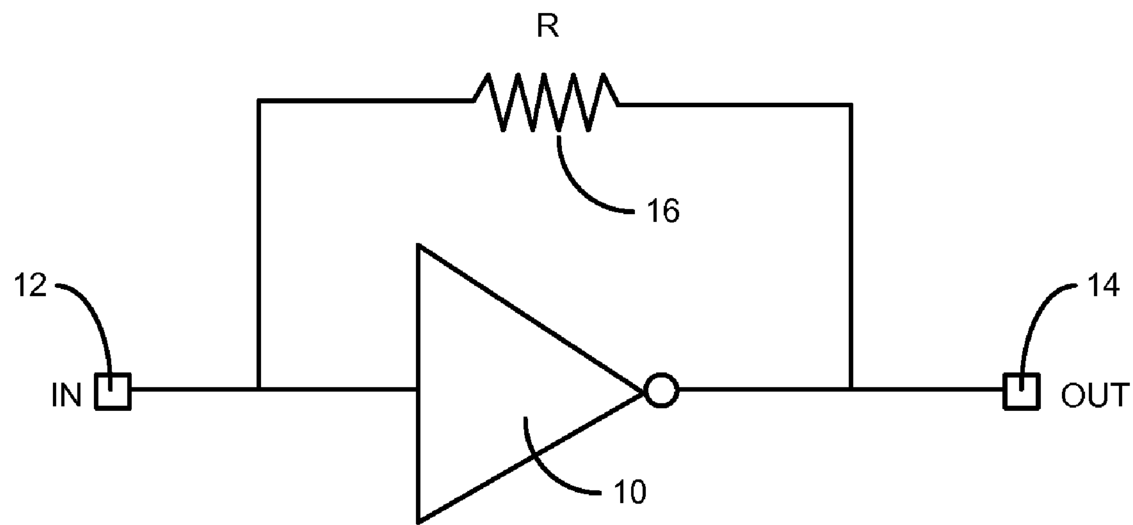
FIG. 1 is a circuit diagram of a conventional inverting amplifier with negative feedback.

Conceptually, the circuit of FIG. 1 is simple. Its input and output nodes 12, 14 are tied through the resistor 16 such that the input and output voltages of the inverter 10 equilibrate. This feedback is useful because it normally sets the inverter 10 to operate at the point of high gain, regardless of its actual threshold voltage. The feedback resistor 16 compensates for any uncertainty in threshold voltage due to variations in transistor properties. In order for the amplifier to amplify high frequency signals, the resistance R of the resistor 16 must be large enough such that the time constant of the feedback path is much longer than the time constant of the forward path, than the transition time, and than the maximum run-length of the incoming signal. These requirements pose significant challenges to implementation of the feedback resistor 16 in digital CMOS technologies. Polysilicon resistors have generally well-behaved characteristics, but the resistivity of polysilicon is quite low. In 0.18 μm CMOS technology, it is impractical to build polysilicon resistors having resistance greater than about 10 kΩ because of the prohibitive amount of silicon real estate they require and further because of the associated parasitic capacitances they introduce.

A more effective implementation of a large resistance in CMOS relies upon a weakly conducting transistor. If a transistor is biased near its subthreshold region, the resistance between its source and drain terminals can be very large. This solution, however, poses another set of challenges. First, the transistor must be biased precisely to obtain the desired resistance because the resistance is highly variable when the transistor operates near its subthreshold region. Secondly, the I-V characteristic of the transistor is highly non-linear so that the device resistance is highly dependent upon the amplitude of the feedback signal. A pass-gate resistor 20, illustrated in the circuit diagram of FIG. 2, may be implemented using a pass-gate consisting of one PMOS transistor 26 and one NMOS transistor 28 connected in parallel between the input and output nodes 12, 14. The gates of the PMOS and NMOS transistors 26, 28, also labeled P1 and N1, may be biased at fixed voltages biasV+ and biasV− respectively. In typical integrated circuit fabrication, the semiconductor wells, (the bulk or body) in which the transistors are formed are connected to $V_{DD}$ and ground for the PMOS and NMOS transistors 26, 28, respectively. The device then provides the active feedback resistance 16 between the input and output nodes 12, 14 of the inverter 10 of FIG. 1.

As is well known, PMOS stands for p-type metal oxide semiconductor and NMOS stands for n-type metal oxide semiconductor, where the type is the semiconductivity type of the conducting channel region underlying the transistor gate or the wells in which the transistors are formed. A thin insulating or oxide layer exists between the channel and the gate electrode of the MOS transistor. NMOS and PMOS transistors are combined in a single integrated circuit to form CMOS (complementary MOS) circuits. The MOS source and drain are of the opposite conductivity type from the channel and provide the principal or current electrodes coupling the MOS transistor to a principal current path between other circuit elements through the transistor.

Figure 2:
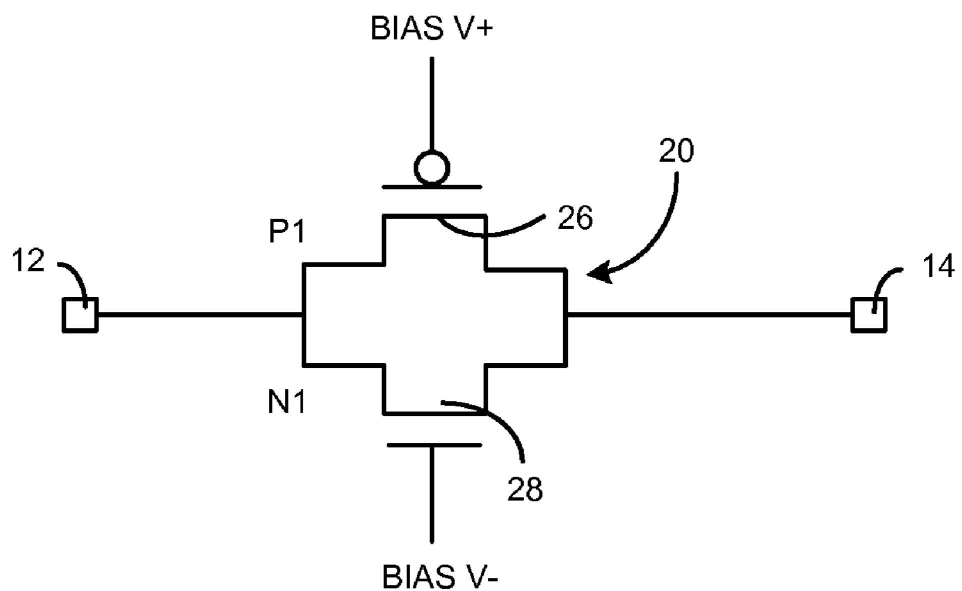
FIG. 2 is a circuit diagram of a pass-gate resistor usable as an active feedback resistor and including an NMOS/PMOS transistor pair.
Figure 3:
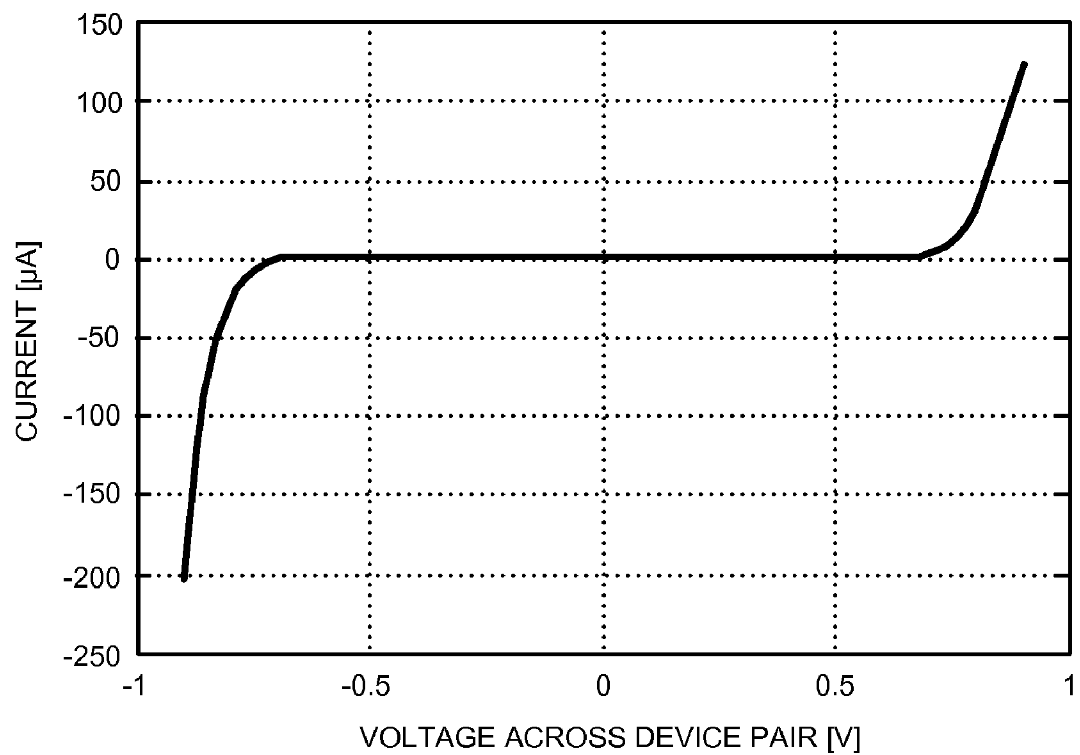
FIG. 3 is a plot of the current-voltage characteristics of the pass-gate resistor of FIG. 2.

The I-V characteristics of such an NMOS/PMOS pass-gate resistor are illustrated in the plot of FIG. 3 for a 1.8V ($V_{DD}$), 0.18 μm CMOS process in which the length of each transistor gate is 0.18 μm and its width is 10 μm. The bias voltages biasV+ and biasV− are chosen in this embodiment as 1.1V and 0.6V, respectively. The node 12 of the pass gate of FIG. 2 is held at a fixed voltage of 0.9V. This emulates an actual operating environment where an input signal is applied at the input node 12 of FIG. 1. The input signal is assumed to be low-swing and is biased close to the threshold voltage of the inverter, that is, at approximately $V_{DD}/2=0.9$V. The figure shows the current through the pass-gate resistor as a function of the voltage across it.

Figure 4:
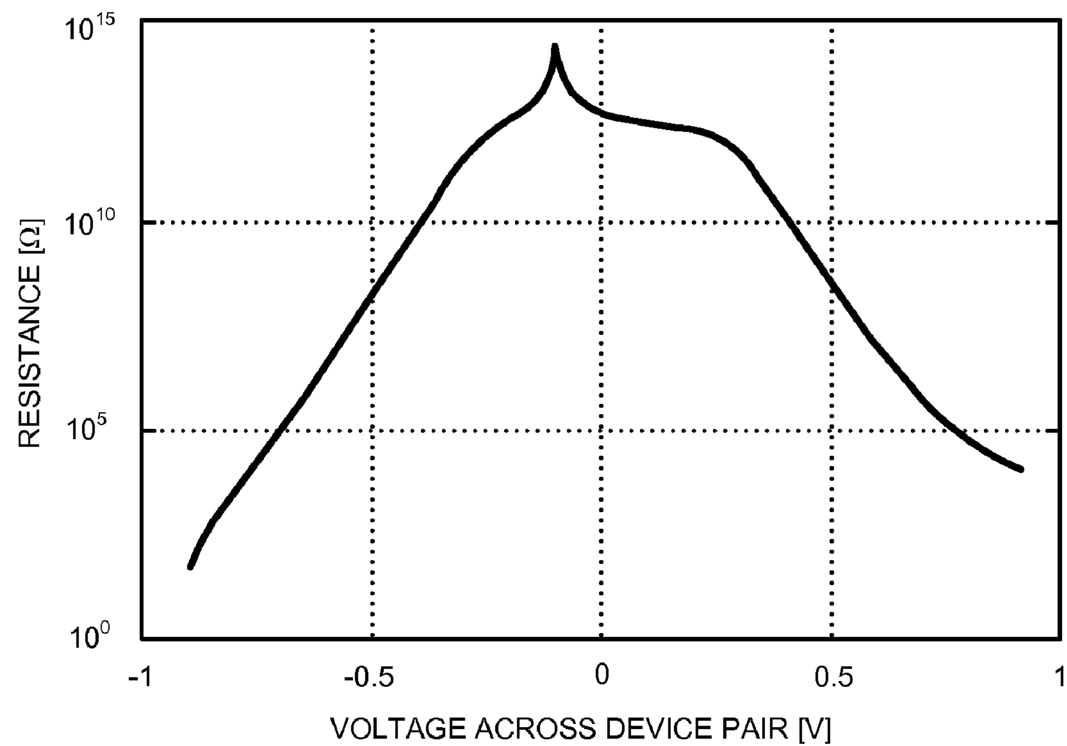
FIG. 4 is a plot of the resistance of the pass-gate resistor of FIG. 2 as a function of the voltage across the device.

The illustrated I-V characteristic is highly non-linear and results in a highly variable resistance, illustrated in the chart of FIG. 4, varying with the voltage across the device. Although the device provides a very high resistance when properly biased, the resistance varies by more than 9 orders of magnitude over the full voltage range.

Figure 5:
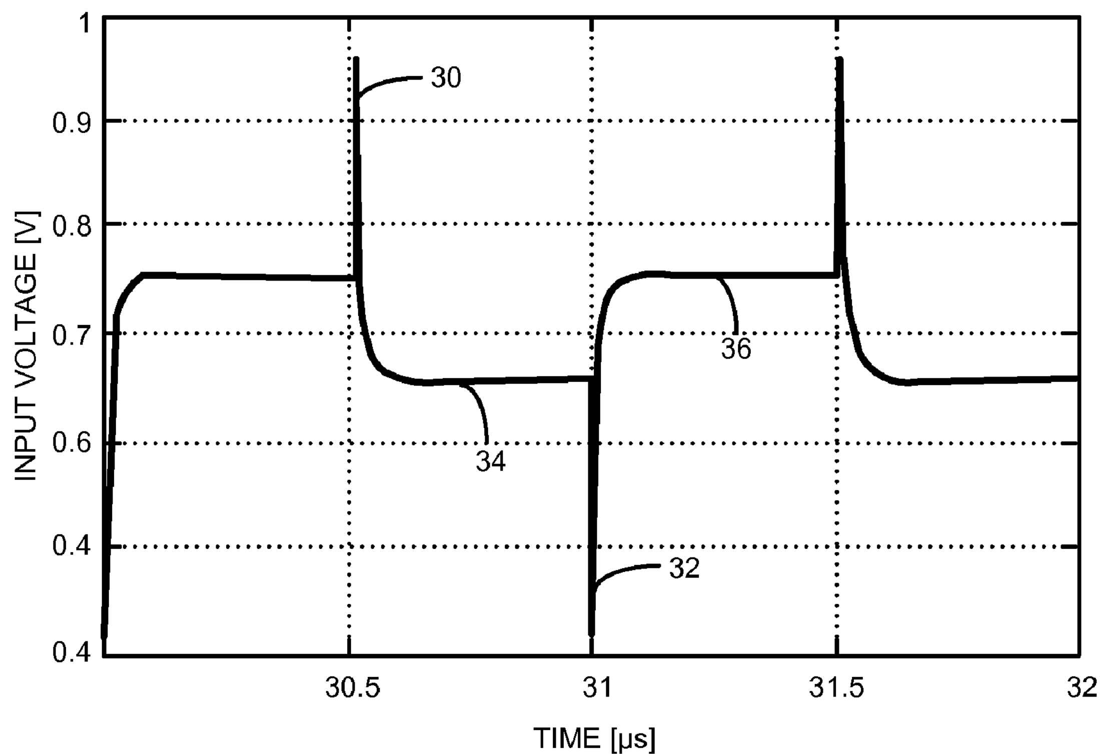
FIG. 5 is a timing diagram of the input voltage of the pass-gate active resistor of FIG. 2.
Figure 6:
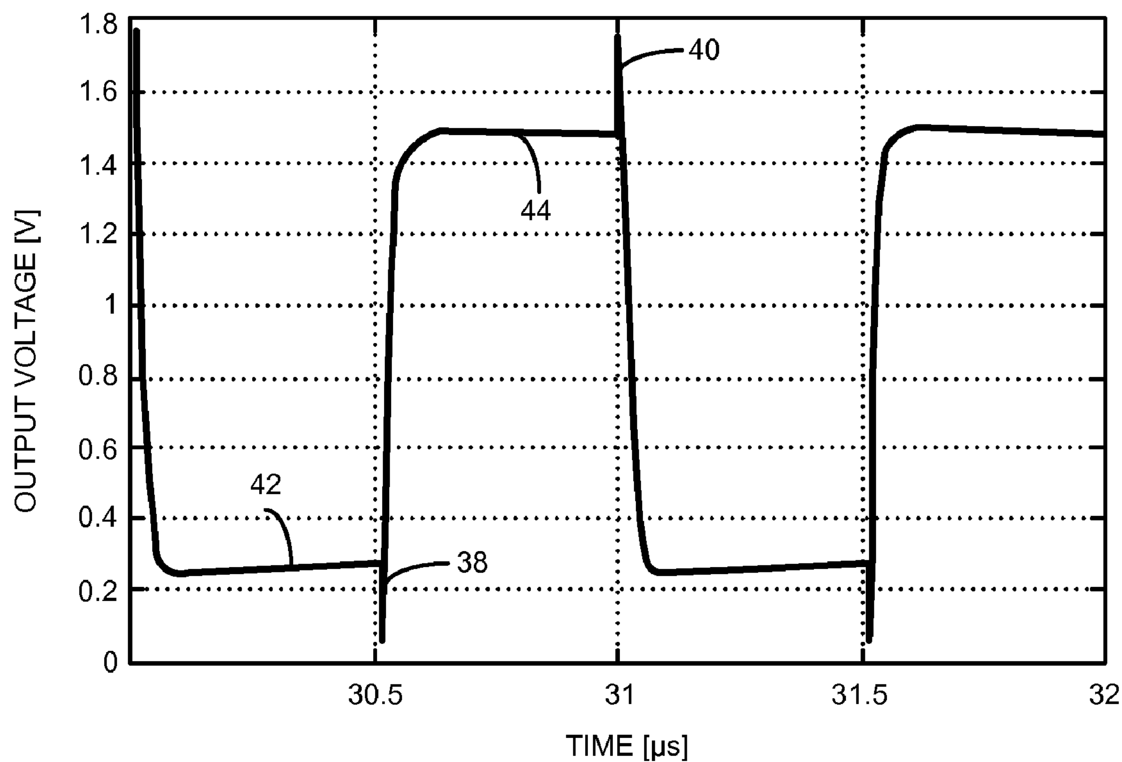
FIG. 6 is a timing diagram of the output voltage of the active resistor of FIG. 2.

Such a wide variability makes it particularly challenging to design sense amplifiers with reliable operation over an adequate signal range. The highly variable resistance of the pass-gate resistor may cause failure when the output swing of the amplifier is large. As illustrated in the input signal trace of FIG. 5 and the output signal trace of FIG. 6, when the output voltage gets close to the voltage rails at spikes 30, 32, the resistance of the pass-gate can drop below 10 kΩ, as has been shown in FIG. 4. Note that the time periods between transitions in FIGS. 5 and 6 are much longer than expected in normal operation but may be representative of long bit streams of the same polarity. At the transitions, the voltage spikes of the input voltage of FIG. 5 initially go toward the desired voltage rail of the device but then collapse toward medium voltage levels 34, 36. The output voltage of FIG. 6 exhibits similar complementary spikes 38, 40 at the transitions followed by collapse to medium voltage levels 42, 44. With an on-chip node capacitance of about 100 fF, the feedback time constant is only 1 ns, which is dangerously short compared to typical forward path time constants in this process, thus easily causing the amplifier to become unstable.

This failure mode occurs because, when the output signal becomes large, the pass-gate resistance becomes too low such that it allows the output (which is inverted from the input) to overpower the input, causing the sense amplifier to fail. Consider a low-swing, falling edge at the amplifier input, such as an initial negative edge 32 in FIG. 5. The inverter provides a negative gain so the signal at the output in FIG. 6 is, at least initially, a rising edge 40 with a larger swing. With the simple pass-gate resistor 20 of FIG. 2, if the output swing becomes too large, the voltage at the output node 14 becomes high enough to drive the PMOS transistor 26 out of subthreshold conduction such that the PMOS transistor 26 then provides a low-resistance path between the input node 12 and the output node 14. The output signal may then overpower the input, driving it in the opposite direction and causing the receiver to amplify erroneously. Note that on every new transition of the input, the output quickly overpowers the input signal, causing it to swing in the opposite, erroneous direction. This causes short, erroneous spikes instead of stable transitions at the output. The existing implementation of the pass-gate resistor fails to maintain a high resistance over a wide range of signal voltage because, for fixed gate bias voltages (biasV+ and biasV−), one transistor in the pass-gate quickly moves away from near-subthreshold conduction as soon as the signal deviates from its nominal voltage. This operation occurs because one transistor moves into saturation on every rising edge; the other one, on the falling edge.

One aspect of the present design recognizes that in order to maintain a more consistent resistance, the gate bias voltages must move concomitantly with the signal, so as to keep the transistors operating near the subthreshold region across the full signal range. In some embodiments of the present design, such operation is accomplished by modulating the gate bias voltages of the pass-gate based on the voltage levels at its own terminals. In view of such operation, such a resistor may be called an active pass-gate resistor.

Figure 7:
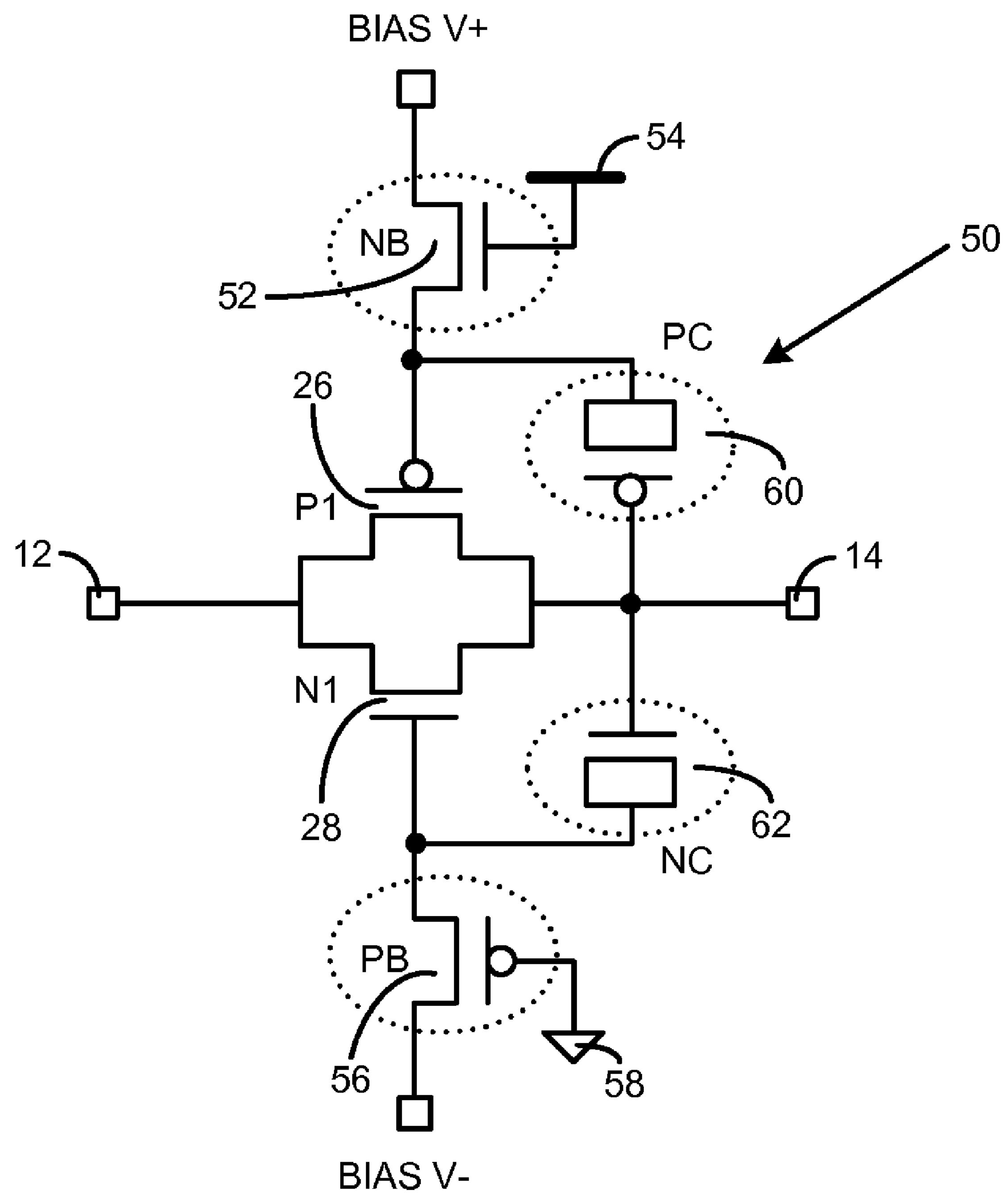
FIG. 7 is a circuit diagram of an active resistor including bootstrapping transistors in accordance with an embodiment of the present invention.

The circuit diagram of FIG. 7 illustrates one embodiment of an active pass-gate resistor 50, which may be used as the feedback resistor 16 of FIG. 1. A complementary pass-gate is composed of the PMOS transistor 26 or P1 and the NMOS transistor 28 or N1 and provides the main resistive path through their current electrodes. The gate of the PMOS transistor 26 is tied to the positive bias voltage biasV+ through an NMOS bootstrapping transistor 52 or Nb having its gate connected to a predetermined positive supply voltage 54, for example 1.8V when the positive bias voltage biasV+ is 1.1V. In complementary fashion, the gate of the NMOS transistor 28 is tied to the negative voltage biasV− through a PMOS bootstrapping transistor 56 or Pb with its gate connected to a predetermined supply voltage 58, such as ground when the negative bias voltage biasV− is 0.6V. The channels of the bootstrapping transistors Nb and Pb are at the bias voltages biasV+ and biasV−, respectively. A PMOS capacitor 60 or Pc and an NMOS capacitor 62 or Nc couple the output node 14, which is the output of the amplifier, to the gates of the PMOS and NMOS pass-gate transistor 26, 28, respectively. The PMOS and NMOS capacitors 60, 62 may be formed from PMOS and NMOS transistors with their sources and drains tied together to form one contact and their gates forming another contact of the MOS capacitors. The gates of the PMOS and NMOS transistor capacitors 60, 62 are coupled to the output node 14.

The modulation of the gate voltages occurs through bootstrapping. The bootstrapping transistors 52, 56 function to hold the gates of the pass-gate transistors 26, 28 at bias voltages biasV+ and biasV−, respectively, but only very weakly. The bootstrapping transistors 52, 56 may be narrow and have long channel lengths so that they provide highly resistive paths from the bias voltages to the gates of the pass-gate transistors 26, 28. In addition, biasV+tends toward $V_{DD}$, while biasV− tends toward ground. Because the upper bootstrapping transistor 52 is an NMOS device, it passes biasV+weakly. The analogous effect occurs for the lower PMOS bootstrapping transistor 56 and biasV−. Together, the sizing and type of the bootstrapping devices keep the gates of the pass-gate transistors 26, 28 semi-floating at the appropriate bias voltages.

Capacitors 60, 62 may be implemented as transistors, which may be wide and have long channel lengths to provide high coupling capacitance. Their function is to capacitively couple the output node 14 of the amplifier to the gates of the pass-gate transistors 26, 28. Because the gates of the pass-gate transistors 26, 28 are semi-floating and weakly held, their voltage levels will swing concomitantly with the output signal at the output node 14. The gate voltages are thus effectively modulated by the signal itself.

Figure 8:
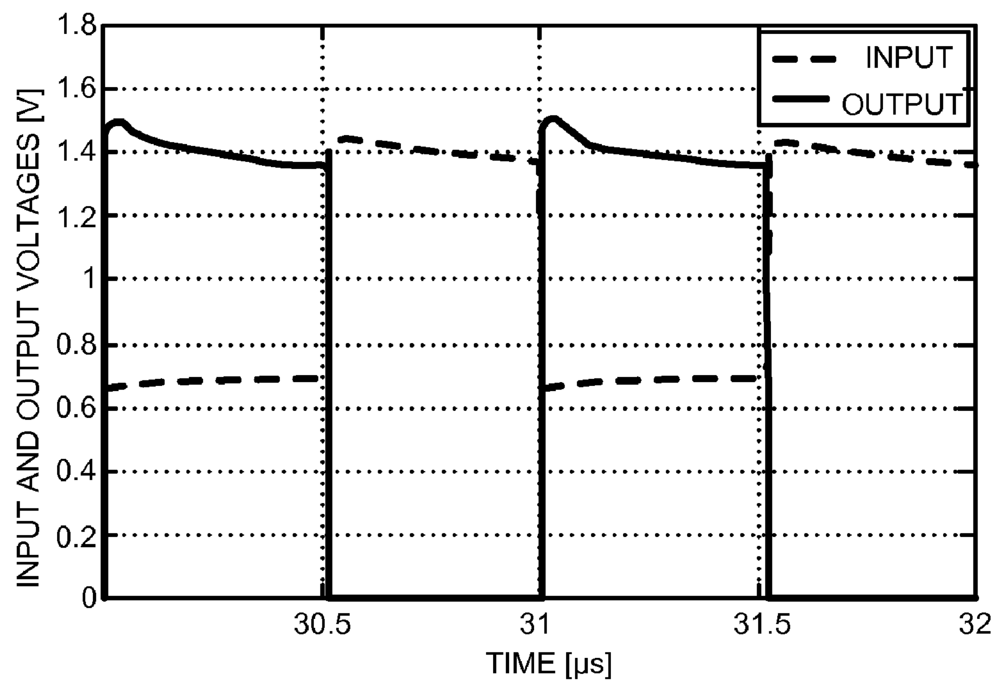
FIG. 8 is a timing diagram of the input and output voltages of the active resistor of FIG. 7.

Unlike the simple pass-gate resistor 20 of FIG. 2, the active pass-gate resistor 50 of FIG. 7 can be used to reliably provide feedback across an inverting amplifier over the full signal voltage range. Again consider a low-swing, falling edge at the input of the inverting amplifier 10 of FIG. 1 but with the active feedback resistor 50. The input and output voltages are illustrated in the signal traces of FIG. 8. The output signal shows a rising edge with a larger swing, and this edge couples through the coupling capacitors 60, 62 so that the gate voltage of PMOS pass-gate transistor 26 rises concomitantly with the output. This prevents the PMOS pass-gate transistor P1 from moving out of subthreshold conduction because its gate voltage never goes too low relative to the output signal. Note that the analogous effect holds for the case of a rising edge at the input.

Figure 9:
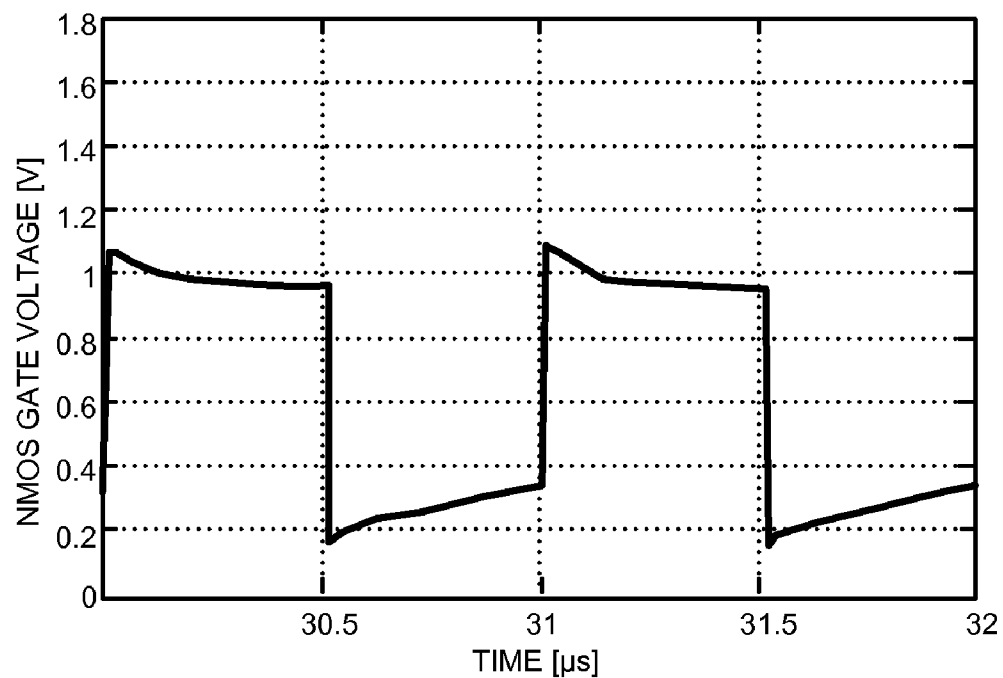
FIG. 9 is a timing diagram of the gate voltage of the NMOS pass-gate transistor of FIG. 7.

It is recognized that the gate of the NMOS pass-gate transistor 28 also rises in unison with the output, and therefore it may be at risk of moving away from subthreshold. However, for a rising edge when the output swing is large, the NMOS pass-gate transistor 28 cannot pass the output voltage, and therefore its resistance does not drop appreciably for a rising edge, as is shown in the signal trace in FIG. 9 for the gate voltage of the NMOS pass-gate transistor 28.

The active pass-gate resistor 50 is a simple way of implementing a high resistance in an integrated circuit. It requires only a small amount of silicon real estate and introduces very little parasitic capacitance. Compared to the simple pass-gate resistor 20 of FIG. 2, its resistance is much less variable and it can maintain a high resistance profile over a wide range of signal levels.

The challenge of implementing high resistances in CMOS is not unique to the design of sense amplifiers. Although the active pass-gate resistor has been described only in the context of building a sense amplifier, it finds applications in many other areas of analog and digital circuit design, including termination circuits, filters, and resistive loads. The active pass-gate resistor is a dynamic circuit, because over time the bootstrapped nodes will slowly droop back to their nominal voltages due to transistor leakage currents. If the signal is held at DC, the device reduces to the circuit of FIG. 2. However, leakage time constants are on the order of milliseconds; as long as the signal has a maximum transition period that is shorter than the leakage time constant, the bootstrapped nodes will be refreshed properly.

Figure 10:
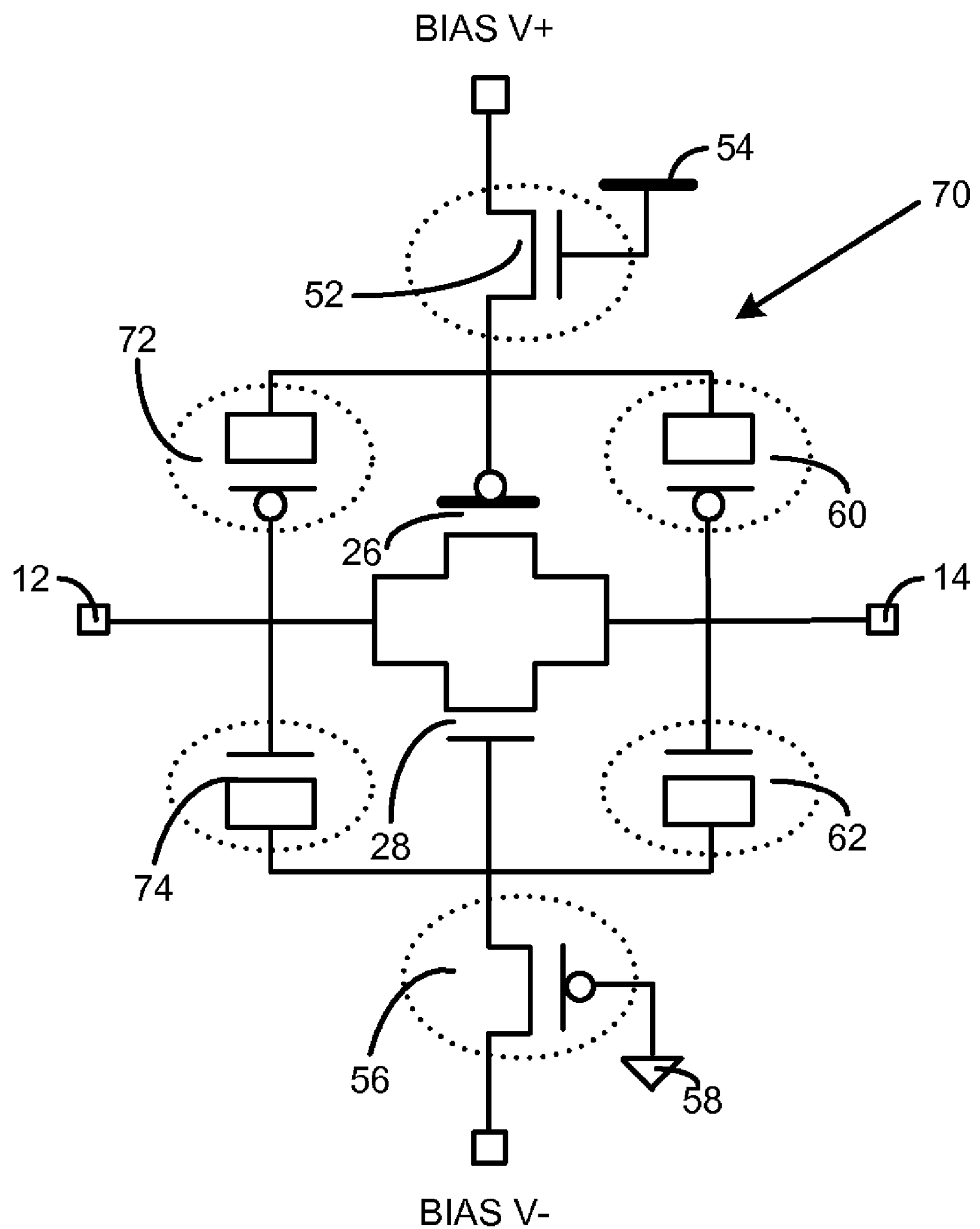
FIG. 10 is a circuit diagram of a symmetric version of the active resistor of FIG. 7 in accordance with an embodiment of the present invention.

The active resistor 50 of FIG. 7 is one of many possible circuit configurations of the active resistor. It may be referred to as the standard 6 T embodiment. As shown, this circuit is asymmetric. On the other hand, an 8 T active resistor 70, illustrated in the circuit diagram of FIG. 10, is made symmetric by adding a second PMOS bootstrapping transistor 72 between the node 12 and the gate of the PMOS pass-gate transistor 26 and a second NMOS bootstrapping transistor 74 between the node 12 and the gate of the NMOS pass-gate transistor 28. As a result, the resistor 70 is symmetric across the nodes 12, 14 and can be operated in either direction with the input and output nodes 12, 14 being interchanged.

Figure 11:
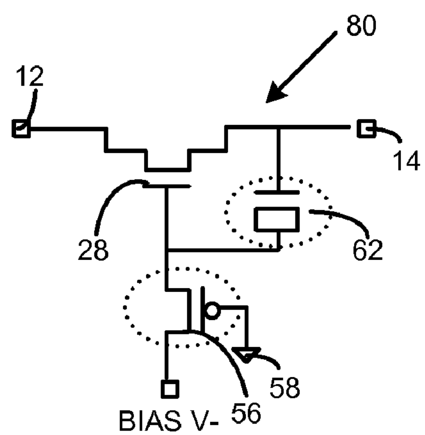
FIGS. 11-14 are circuit diagrams of one-sided versions of the active resistors of FIGS. 7 and 10 in accordance with several embodiments of the present inventions.
Figure 12:
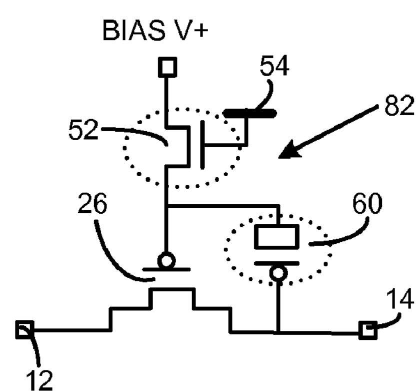
Figure 13:
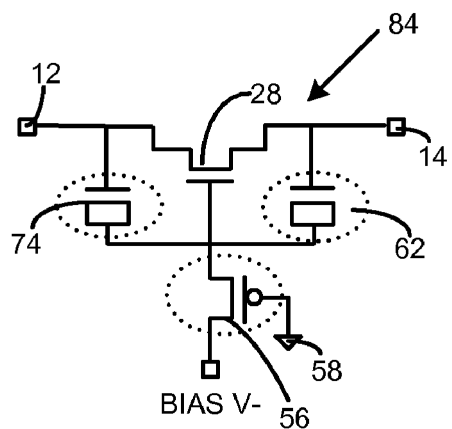

Over a certain range of inverter threshold voltages, it is possible to use only one half of the circuit, because one of the transistors in the complementary pair is dominant. A 3-transistor single-sided NMOS active resistor 80, illustrated in the circuit diagram of FIG. 11, includes only the NMOS pass-gate transistor 28 and the associated PMOS bootstrapping transistor 56 and NMOS coupling capacitor 62. Similarly, a 3-transistor single-sided PMOS active resistor 82, illustrated in the circuit diagram of FIG. 12, includes only the PMOS pass-gate transistor 26 and the associated NMOS bootstrapping transistor 52 and PMOS coupling capacitor 60. Further, a 4-transistor single-sided NMOS active resistor 84, illustrated in the circuit diagram of FIG. 13, is made symmetric by adding to the active resistor 80 of FIG. 11 the second NMOS coupling capacitor 74 to the node 12. Similarly, a 4-transistor single-sided PMOS active resistor 86, illustrated in the circuit diagram of FIG. 14, is made symmetric by adding to the active resistor 82 of FIG. 12 the second PMOS coupling capacitor 72 to the node 12.

Figure 14:
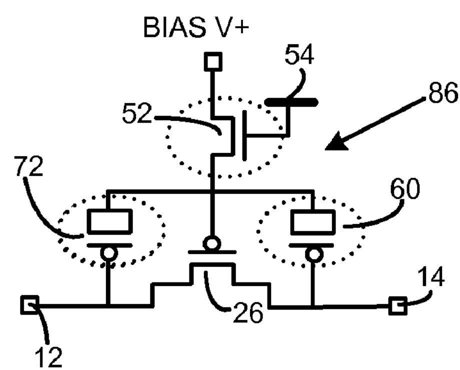

The active resistor 86 of FIG. 14 facially resembles a conventional pass gate transistor, for example, as disclosed by Hopkins et al, "Circuit Techniques to Enable 430 Gb/s/mm$^2$ Proximity Communication," 2007 *IEEE Solid-State Conference*, Paper 20.7, pp. 368, 369, 609, 11 Feb. 2007. However, in a pass gate transistor, the biasV+terminal is controlled by a select signal switching the transistor between its pass and blocking states during the timed operation of the pass gate transistor. On the other hand, in an active pass gate resistor, the biasV+voltage (as well as the corresponding biasV− voltage in other embodiments) is pre-selected for a desired finite resistance and is maintained at that predetermined value during the operation of the active resistor.

The amplifiers described in the above embodiments can be characterized as single-end inverting amplifiers. The invention can be extended to any differential amplifier. The differential amplifier may have two variable inputs. One useful differential amplifier has two inputs to which two complementary signals are expected to be applied and further has two complementary outputs, the positive and negative versions of the difference of the two inputs. The described embodiments may form part of the differential amplifier and in some embodiments be replicated in it.

Instead of using a transistor, it is possible to implement the coupling capacitors as passive elements. For example wire pitchfork or metal-insulator-metal (MIM) structures can be used as capacitors. These structures generally provide a fixed capacitance but may require more chip real estate for a given capacitance.

Many fabrication processes also offer mixed threshold transistors. It is possible then to use transistors with different threshold voltages to implement the circuits discussed herein. This allows more freedom in the design to obtain higher performance over a certain range of fixed bias voltages.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An active resistor coupled between first and second principal nodes, comprising:

a MOS first pass-gate transistor of a first conductivity type having principal electrodes coupled between the principal nodes;

a MOS first bootstrapping transistor of a second conductivity type having principal electrodes coupled between a gate of the first pass-gate transistor and a first bias voltage held at a predetermined value during the operation of the active resistor; and a first coupling capacitor coupled between the gate of the first pass-gate transistor and the second principal node.

2. The active resistor of claim 1, wherein the first coupling capacitor comprises a MOS transistor of the first conductivity type having a source and a drain tied together to form one contact and a gate forming another contact.

3. The active resistor of claim 1, further comprising a second coupling capacitor coupled between the gate of the first pass-gate transistor and the first principal node.

4. The active resistor of claim 1, wherein the first conductivity type is n-type and further comprising:

a MOS second pass-gate transistor of p-type having principal electrodes coupled between the principal nodes;

a MOS second bootstrapping transistor of n-type having principal electrodes coupled between a gate of the second pass-gate transistor and a second bias voltage higher than the first bias voltage; and a second coupling capacitor coupled between the gate of the second pass-gate transistor and the first principal node.

5. The active resistor of claim 4, further comprising a third coupling capacitor coupled between the gate of the second pass-gate transistor and the first principal node and a fourth coupling capacitor coupled between the gate of the second pass-gate transistor and the second principal node.

6. The active resistor of claim 4, wherein a gate of the first bootstrapping transistor is coupled to a power supply voltage greater than the first bias voltage and a gate of the second bootstrapping transistor is connected to a power supply voltage less than the second bias voltage.

7. The active resistor of claim 4, wherein each of coupling capacitors comprises a MOS transistor having a source and a drain tied together to form one contact and a gate forming another contact.

8. A feedback amplifier, comprising:

an inverting amplifier coupled between an input node and an output node; and an active resistor coupled between the input node and the output node to form with the inverting amplifier a feedback amplifier and comprising a MOS first pass-gate transistor of a first conductivity type having principal electrodes coupled between the input and output nodes, a MOS first bootstrapping transistor of a second conductivity type having principal electrodes coupled between a gate of the first pass-gate transistor and a first bias voltage, and a first coupling capacitor coupled between the gate of the first pass-gate transistor and the output node.

9. The feedback amplifier of claim 8, wherein the active resistor further comprises a second coupling capacitor coupled between the gate of the first pass-gate transistor and the input node.

10. The feedback amplifier of claim 8, wherein the first conductivity type is n-type and wherein the active resistor further comprises a MOS second pass-gate transistor of p-type having principal electrodes coupled between the input and output nodes, a MOS second bootstrapping transistor of n-type having principal electrodes coupled between a gate of the second pass-gate transistor and a second bias voltage greater than the first bias voltage, and a second coupling capacitor coupled between the gate of the second pass-gate transistor and the input node.

11. The feedback amplifier of claim 10, wherein the active resistor further comprises a third coupling capacitor coupled between the gate of the first pass-gate transistor and the input node and a fourth coupling capacitor coupled between the gate of the second pass-gate transistor and the input node.

12. The feedback amplifier of claim 10, wherein a gate of the first bootstrapping transistor is coupled to a power supply voltage greater than the first bias voltage and a gate of the second bootstrapping transistor is coupled to a power supply voltage less than the second bias voltage.

13. The feedback amplifier of claim 8 incorporated into a differential amplifier.

* * * * *